(12) United States Patent
Kim et al.

(10) Patent No.: US 12,156,390 B2
(45) Date of Patent: Nov. 26, 2024

(54) ELECTROMAGNETIC WAVE SHIELDING FILM, AND METHOD FOR MANUFACTURING SAME

(71) Applicants: LG ELECTRONICS INC., Seoul (KR); RESEARCH & BUSINESS FOUNDATION SUNGKYUNKWAN UNIVERSITY, Gyeonggi-do (KR)

(72) Inventors: Byungsung Kim, Seoul (KR); Seungnam Cha, Seoul (KR); Sangyeon Pak, Gyeonggi-do (KR); Taehun Kim, Gyeonggi-do (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/245,299

(22) PCT Filed: Aug. 25, 2021

(86) PCT No.: PCT/KR2021/011351
§ 371 (c)(1),
(2) Date: Mar. 14, 2023

(87) PCT Pub. No.: WO2022/059953
PCT Pub. Date: Mar. 24, 2022

(65) Prior Publication Data
US 2023/0363126 A1    Nov. 9, 2023

(30) Foreign Application Priority Data
Sep. 18, 2020 (KR) .................. 10-2020-0120749

(51) Int. Cl.
*H05K 9/00* (2006.01)

(52) U.S. Cl.
CPC ......... *H05K 9/0084* (2013.01); *H05K 9/0088* (2013.01)

(58) Field of Classification Search
CPC .................................................. H05K 9/0088
See application file for complete search history.

(56) References Cited

U.S. PATENT DOCUMENTS 5,399,432 A * 3/1995 Schleifstein ............. B05D 5/12
428/403

FOREIGN PATENT DOCUMENTS

| JP | 2006-140280 | 6/2006 |
| JP | 2007-142080 | 6/2007 |
| JP | 2011-035213 | 2/2011 |
| KR | 10-2009-0072051 | 7/2009 |
| KR | 10-1011938 | 2/2011 |

OTHER PUBLICATIONS

PCT International Application No. PCT/KR2021/011351, International Search Report dated Dec. 3, 2021, 6 page.

* cited by examiner

*Primary Examiner* — Hung V Ngo
(74) *Attorney, Agent, or Firm* — LEE, HONG, DEGERMAN, KANG & WAIMEY

(57) ABSTRACT

An electromagnetic wave shielding film having: a base substrate; and an electromagnetic wave shielding layer disposed on the base substrate, where the thickness of the electromagnetic wave shielding layer is 1 nm to 50 nm. In addition, the shielding layer includes: a first layer on the base substrate; a second layer on the first layer; and a third layer on the second layer, wherein the first layer, the second layer, and the third layer include copper sulfide.

12 Claims, 5 Drawing Sheets

【Fig. 1】
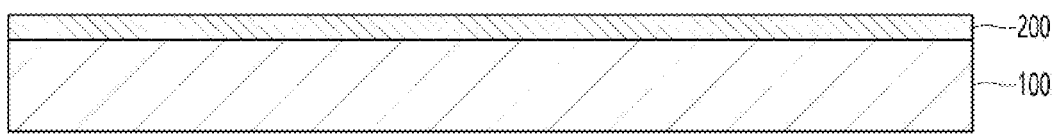
【Fig. 2】
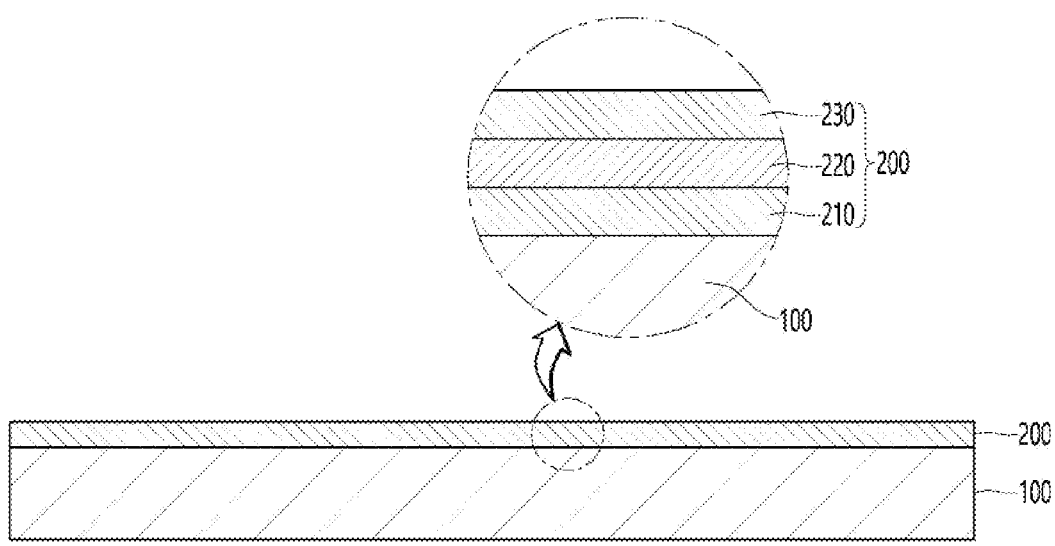
【Fig. 3】
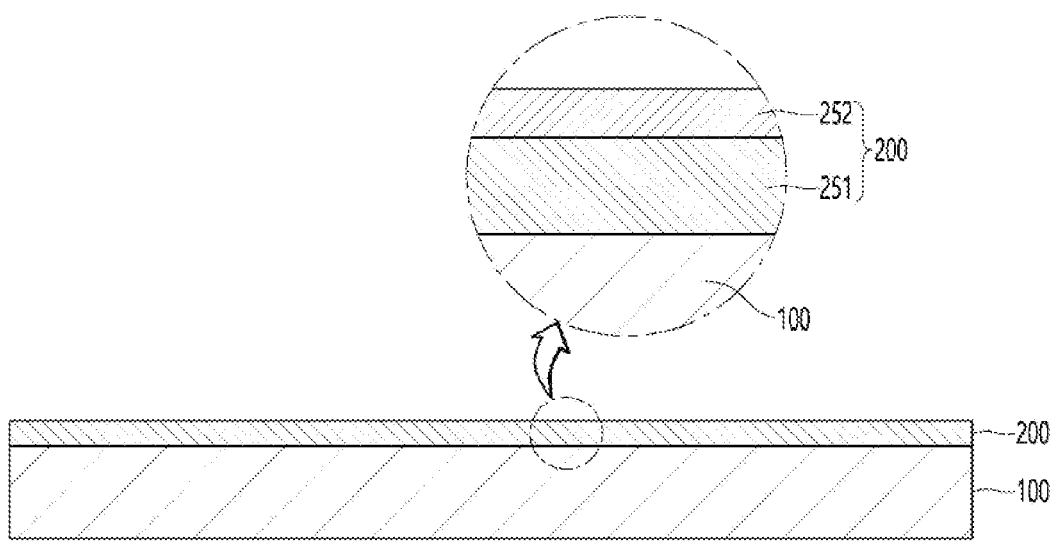

[Fig. 4]
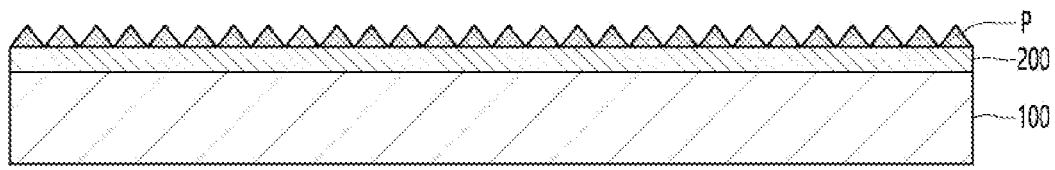
[Fig. 5]
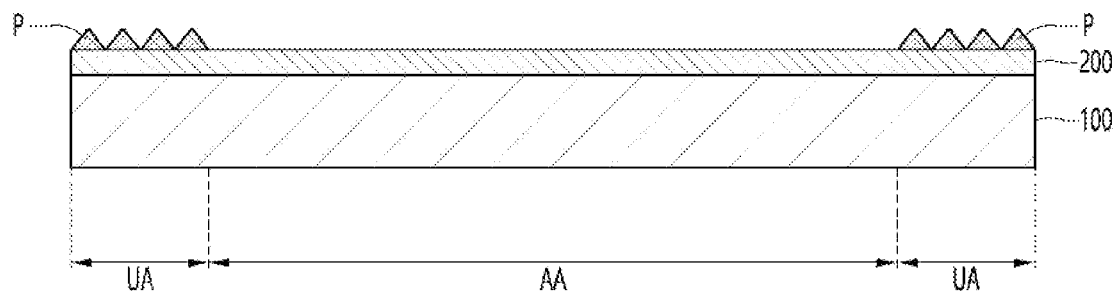
[Fig. 6]
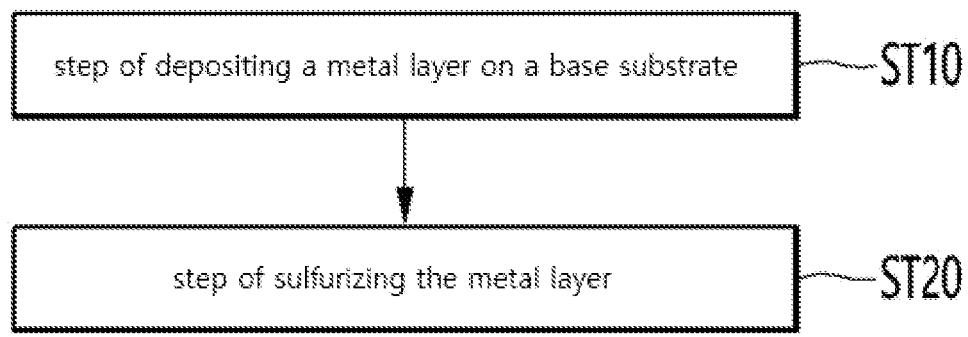

[Fig. 7]
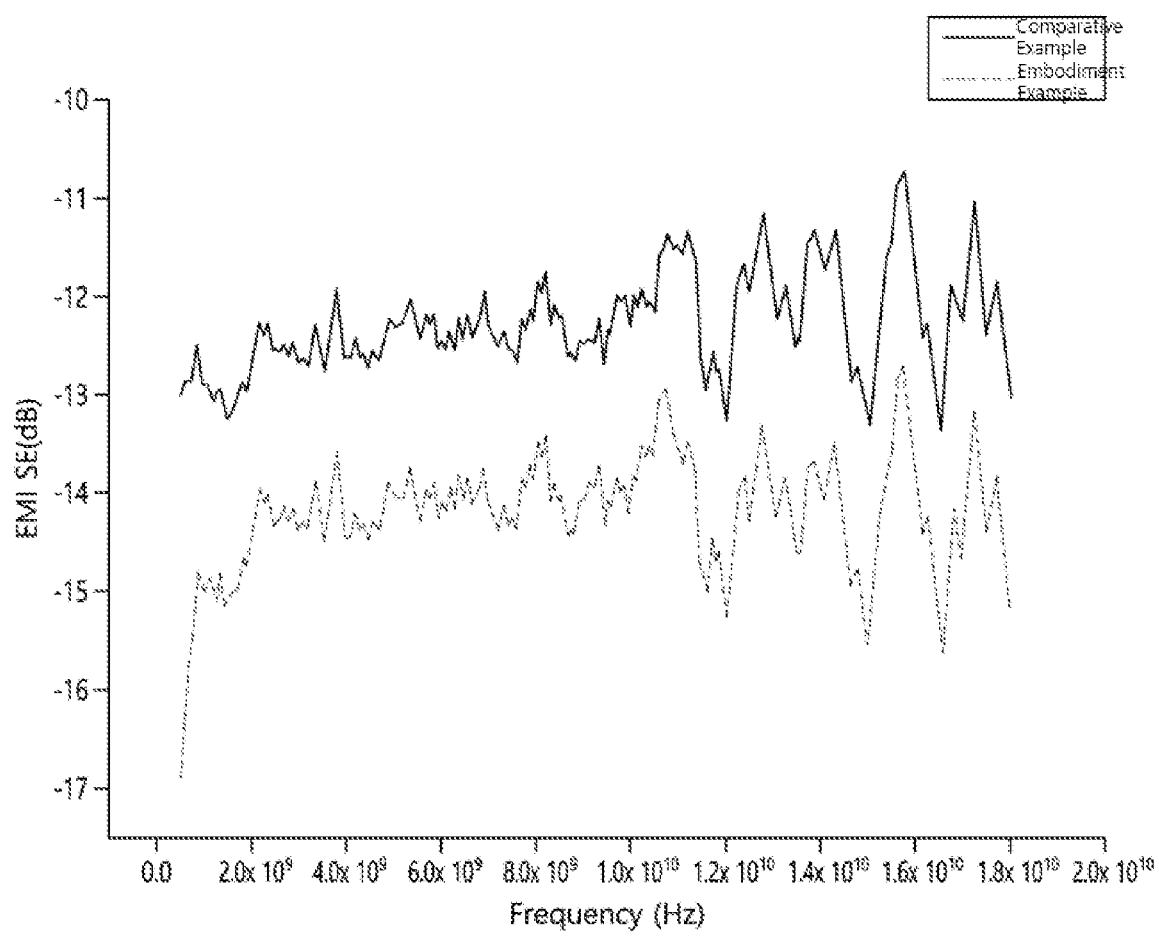

[Fig. 8]
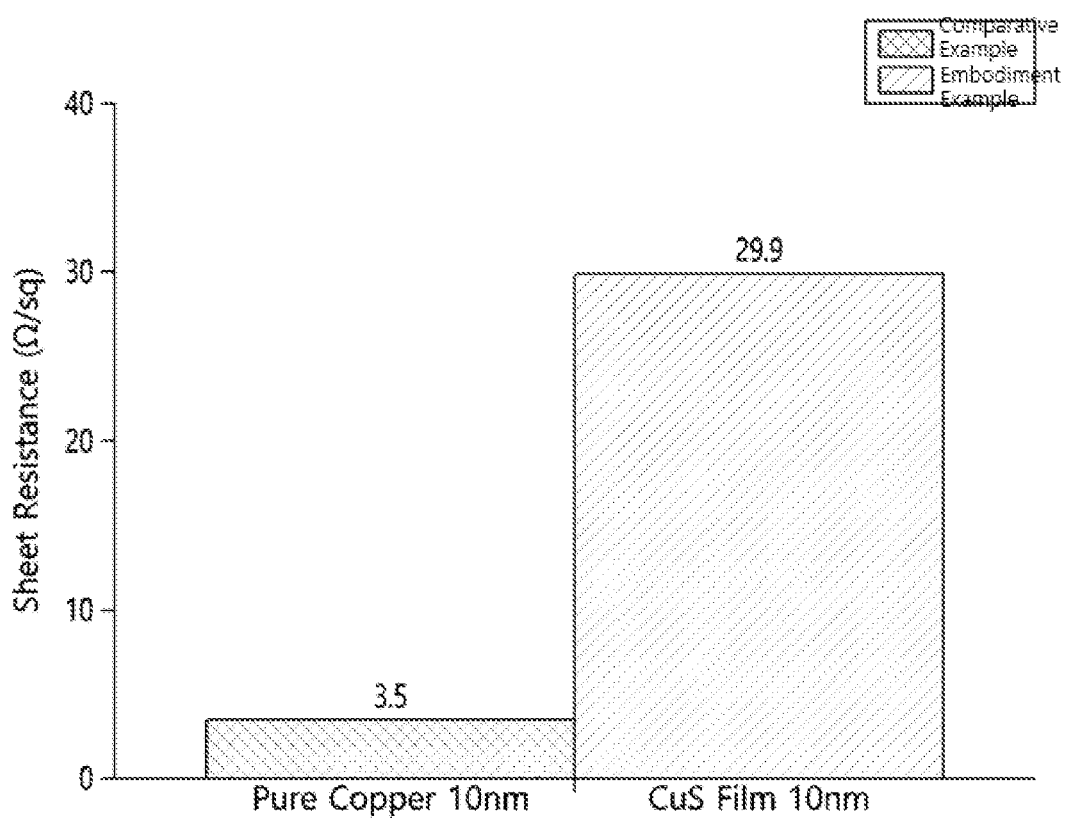

【Fig. 9】
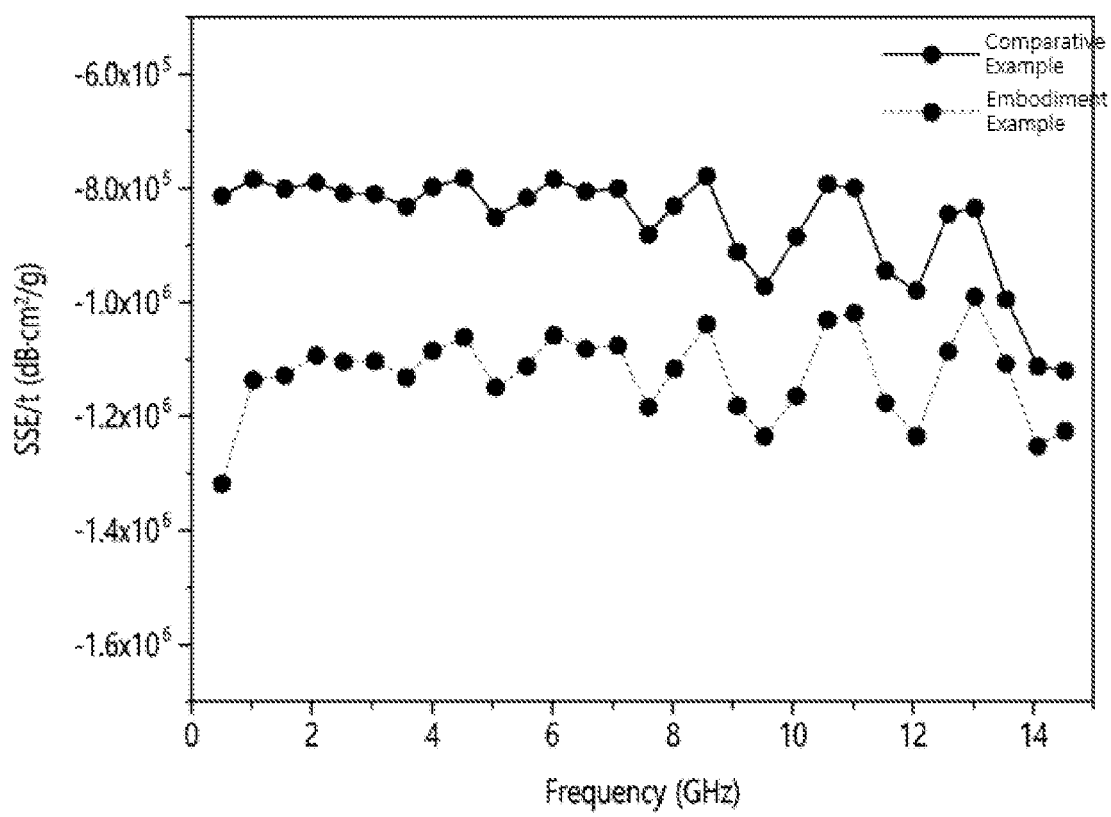

ELECTROMAGNETIC WAVE SHIELDING FILM, AND METHOD FOR MANUFACTURING SAME

CROSS-REFERENCE TO RELATED APPLICATION(S)

This application is the National Stage filing under 35 U.S.C. 371 of International Application No. PCT/KR2021/011351, filed on Aug. 25, 2021, which claims the benefit of earlier filing date and right of priority to Korean Application No. 10-2020-0120749, filed on Sep. 18, 2020, the contents of which are all hereby incorporated by reference herein in their entireties.

TECHNICAL FIELD

An embodiment relates to an electromagnetic wave shielding film, and method for manufacturing same.

BACKGROUND ART

Electromagnetic waves generated from various electronic devices may reduce the performance of electronic devices, and electromagnetic waves emitted to the outside may adversely affect the health of users of electronic devices.

In particular, malfunctions and reduced characteristics of electronic devices may occur due to signal interference of electronic devices by electromagnetic waves.

Conventionally, after forming the electromagnetic wave shielding powder, the electromagnetic wave shielding powder is coated on the substrate to form an electromagnetic wave shielding film on the substrate.

However, in the case of forming a coating layer using the electromagnetic wave shielding powder, a high-temperature process and a transfer process are required, resulting in reduced process efficiency.

In addition, it is difficult to form a coating layer on a large-area substrate.

Therefore, there is a need for an electromagnetic wave shielding film having a new structure and a method for manufacturing the same that may solve the above problems.

DISCLOSURE

Technical Problem

An embodiment relates to an electromagnetic wave shielding film having improved transmittance and electromagnetic wave shielding effect and a manufacturing method thereof.

Technical Solution

An electromagnetic wave shielding film according to an embodiment includes: a base substrate; and an electromagnetic wave shielding layer disposed on the base substrate, a thickness of the electromagnetic wave shielding layer is 1 nm to 50 nm.

Advantageous Effects

Electromagnetic wave shielding properties of the electromagnetic wave shielding film according to the embodiment may be improved.

In detail, the electromagnetic wave shielding properties of the electromagnetic wave shielding film may be improved by inducing a scattering effect by the interface of a shielding layer having a multilayer structure.

In addition, in the electromagnetic wave shielding film, copper sulfide crystal grains having small crystal grains are disposed on the surface of the shielding layer, thereby inducing an electromagnetic wave scattering effect, thereby improving electromagnetic wave shielding properties.

In addition, the electromagnetic wave shielding film according to the embodiment may improve electromagnetic wave shielding characteristics by disposing a pattern layer on one surface of the shielding layer and inducing an electromagnetic wave scattering effect.

In addition, the electromagnetic wave shielding film according to the embodiment may prevent an increase in the thickness of the electromagnetic wave shielding film and a decrease in light transmittance according to the shielding layer by disposing the thickness of the shielding layer in nanometer units.

DESCRIPTION OF DRAWINGS

FIG. 1 is a cross-sectional view of an electromagnetic wave shielding film according to an embodiment.

FIG. 2 is a cross-sectional view of an electromagnetic wave shielding film according to another embodiment.

FIG. 3 is a cross-sectional view of an electromagnetic wave shielding film according to another embodiment.

FIGS. 4 and 5 are cross-sectional views of an electromagnetic wave shielding film according to another embodiment.

FIG. 6 is a view for explaining a process flow chart of a method for manufacturing the electromagnetic wave shielding film according to the embodiment.

FIG. 7 is a graph for explaining electromagnetic wave shielding characteristics of the electromagnetic wave shielding film according to the embodiment.

FIG. 8 is a graph for explaining electrical characteristics of the electromagnetic wave shielding film according to the embodiment.

FIG. 9 is a graph for explaining electromagnetic wave shielding characteristics of the electromagnetic wave shielding film according to the embodiment.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an electromagnetic wave shielding film according to an embodiment, and method for manufacturing same will be described with reference to drawings.

FIG. 1 is a cross-sectional view of an electromagnetic wave shielding film according to an embodiment.

Referring to FIG. 1, the electromagnetic wave shielding film according to the embodiment may include a base substrate 100 and a shielding layer 200.

The base substrate 100 may be transparent. For example, the base substrate 100 may include a transparent substrate capable of transmitting light.

The base substrate 100 may include plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the base substrate 100 may be a flexible substrate having flexible characteristics.

Further, the base substrate 100 may be a curved or bended substrate. That is, the electromagnetic wave shielding film including the base substrate 100 may also be formed to have flexible, curved, or bent characteristics. Accordingly, the electromagnetic wave shielding film according to the embodiment may be changed to various designs.

The shielding layer 200 may be disposed on the base substrate 100. The shielding layer 200 may be disposed in direct contact with the base substrate 100.

The shielding layer 200 may be a layer that blocks electromagnetic waves. That is, the shielding layer 200 may be an electromagnetic wave shielding layer.

The shielding layer 200 may include a material capable of blocking electromagnetic waves. Also, the shielding layer 200 may transmit light. That is, the shielding layer 200 may include a light-transmitting material.

For example, the shielding layer 200 may have a light transmittance of 70% to 99%.

Meanwhile, the shielding layer 200 may be disposed with a constant thickness. In detail, the shielding layer 200 may be disposed with a nanometer-sized thickness.

In detail, the shielding layer 200 may be disposed to a thickness of 50 nm or less. In more detail, the shielding layer 200 may be disposed to a thickness of 1 nm to 50 nm. In more detail, the shielding layer 200 may be disposed to a thickness of 2 nm to 10 nm.

When the thickness of the shielding layer 200 exceeds 50 nm, light transmittance of the electromagnetic wave shielding film may decrease due to the shielding layer 200. Accordingly, when the electromagnetic wave shielding film is applied to a display or the like, the light transmittance may decrease and thus the user's visibility may decrease.

In addition, it is difficult to realize a thickness of the shielding layer 200 of less than 1 nm in terms of a process, and electromagnetic wave shielding characteristics may decrease due to a decrease in the thickness of the shielding layer 200.

The shielding layer 200 may include metal. The shielding layer 200 may include a metal compound. The shielding layer 200 may include a copper compound. For example, the shielding layer 200 may include copper and sulfur. That is, the shielding layer 200 may include copper sulfide (CuS).

FIG. 2 is a cross-sectional view of an electromagnetic wave shielding film according to another embodiment.

Referring to FIG. 2, the shielding layer 200 of the electromagnetic wave shielding film according to the embodiment may have a multilayer structure. In detail, the shielding layer 200 may include a first layer 210, a second layer 220, and a third layer 230.

In detail, the shielding layer 200 may include the first layer 210 disposed on the base substrate 100, the second layer 220 disposed on the first layer 210, and the third layer 230 disposed on the second layer 220.

Although FIG. 2 shows that the shielding layer 200 is formed in a three-layer structure, the embodiment is not limited thereto, and the shielding layer 200 may be formed in a multilayer structure exceeding three layers, such as a fourth layer or a fifth layer.

The first layer 210, the second layer 220, and the third layer 230 may include the same material as each other. In detail, the first layer 210, the second layer 220, and the third layer 230 may have the same composition as each other. Also, the first layer 210, the second layer 220, and the third layer 230 may have different composition ratios. That is, the first layer 210, the second layer 220, and the third layer 230 may have different composition ratios while having the same composition.

In detail, the first layer 210, the second layer 220, and the third layer 230 may include copper and sulfur. That is, the first layer 210, the second layer 220, and the third layer 230 may include a copper sulfide compound.

In addition, the concentration of sulfur and copper in the shielding layer 200 may vary while extending from the first layer 210 toward the third layer 230. In detail, the shielding layer 200 may have an increased sulfur concentration while extending in a direction from the first layer 210 to the third layer 230. In addition, the copper concentration of the shielding layer 200 may decrease while extending from the first layer 210 toward the third layer 230.

That is, the first layer 210 may have a higher copper concentration than the second layer 220 and the third layer 230. Also, the first layer 210 may have a lower sulfur concentration than the second layer 220 and the third layer 230.

Also, the second layer 220 may have a higher copper concentration than the third layer 230. Also, the second layer 220 may have a lower sulfur concentration than the third layer 230.

That is, when the first layer 210 includes $Cu_aS_b$, the second layer 220 includes $Cu_cS_d$, and the third layer 230 includes $Cu_eS_f$, the following equations may be satisfied.

$$a>c>e\ (a,\ c,\ e\ \text{are positive numbers}) \quad [\text{Equation 1}]$$

$$b<d<f\ (b,\ d,\ f\ \text{are positive numbers}) \quad [\text{Equation 2}]$$

Since the shielding layer 200 has a multilayer structure, interfaces may be formed between the respective layers. In detail, a first interface 51 may be formed between the first layer 210 and the second layer 220, and a second interface S2 may be formed between the second layer 220 and the third layer 230.

Accordingly, shielding characteristics of the electromagnetic wave shielding film including the shielding layer 200 may be improved. In detail, the shielding layer 200 includes a plurality of interfaces, such as a first interface and a second interface, and induces a scattering effect of electromagnetic waves incident on the shielding layer through the interfaces, thereby increasing the electromagnetic wave shielding effect of the electromagnetic wave shielding film.

FIG. 3 is a cross-sectional view of an electromagnetic wave shielding film according to another embodiment.

Referring to FIG. 3, the shielding layer 200 of the electromagnetic wave shielding film according to the embodiment may include a base layer 251 and a surface layer 252. In detail, the shielding layer 200 may include the base layer 251 disposed in contact with the base substrate 100 and the surface layer 252 disposed on the base layer 251.

Thicknesses of the base layer 251 and the surface layer 252 may be different from each other. In detail, the thickness of the base layer 251 may be greater than the thickness of the surface layer 252. In more detail, the thickness of the surface layer 252 may be formed to a thickness of 10% or less of the total thickness of the shielding layer 200. In more detail, the thickness of the surface layer 252 may be formed to a thickness of 1% to 5% of the total thickness of the shielding layer 200.

The sizes of the first copper sulfide crystal grains included in the base layer 251 and the second copper sulfide crystal grains included in the surface layer 252 may be different. In detail, the particle diameter of the second crystal grain may be smaller than that of the first crystal grain.

Accordingly, shielding characteristics of the electromagnetic wave shielding film including the shielding layer 200 may be improved. In detail, the shielding layer 200 may improve the electromagnetic wave shielding effect of the electromagnetic wave shielding film by inducing a scattering effect of electromagnetic waves incident on the surface by small crystal grains disposed on the surface layer.

Meanwhile, although not shown in the drawing, the base layer and the surface layer of the shielding layer may each have a multilayer structure as shown in FIG. 2.

FIGS. 4 and 5 are cross-sectional views of an electromagnetic wave shielding film according to another embodiment.

Referring to FIG. 4, the shielding layer 200 of the electromagnetic wave shielding film according to the embodiment may include a pattern layer P. In detail, the shielding layer 200 may include one surface in contact with the base substrate and the other surface opposite to the one surface.

The pattern layer P may be formed on the other surface of the shielding layer 200. The pattern layer 200 may be formed in a concavo-convex pattern. The pattern layer P may be formed in a polygonal shape such as a triangle or a quadrangle, or in a semicircular or elliptical shape having a curved surface.

The pattern layer P may be formed on the entire surface of the other surface of the shielding layer 200.

Alternatively, referring to FIG. 5, the pattern layer P may be partially formed on the other surface of the shielding layer 200.

For example, when the shielding layer 200 is applied to a display or the like, the shielding layer 200 may include an effective area AA through which light is transmitted and an ineffective area UA such as a bezel area through which light is not transmitted.

The pattern layer may not be disposed on the effective area of the shielding layer 200, but may be disposed only on the ineffective area. Accordingly, it is possible to prevent light loss by preventing scattering of other light passing through the effective area, and improve luminance and luminance uniformity.

Electromagnetic wave shielding properties of the electromagnetic wave shielding film according to the embodiment may be improved.

In detail, the electromagnetic wave shielding properties of the electromagnetic wave shielding film may be improved by inducing a scattering effect by the interface of the shielding layer having a multilayer structure.

In addition, in the electromagnetic wave shielding film, copper sulfide crystal grains having small crystal grains are disposed on the surface of the shielding layer, thereby inducing an electromagnetic wave scattering effect, thereby improving electromagnetic wave shielding properties.

In addition, the electromagnetic wave shielding film according to the embodiment may improve electromagnetic wave shielding characteristics by disposing the pattern layer on one surface of the shielding layer and inducing an electromagnetic wave scattering effect.

In addition, the electromagnetic wave shielding film according to the embodiment may prevent an increase in the thickness of the electromagnetic wave shielding film and a decrease in light transmittance according to the shielding layer by disposing the thickness of the shielding layer in nanometer units.

Hereinafter, with reference to FIG. 6, a method of manufacturing the electromagnetic wave shielding film according to an embodiment will be described.

Referring to FIG. 6, the method of manufacturing the electromagnetic wave shielding film according to the embodiment may include depositing a metal layer on a base substrate (ST10) and sulfurizing the metal layer (ST20).

In the step of depositing the metal layer on the base substrate, the metal layer may be deposited on one surface of the base substrate. For example, a copper layer may be deposited on the base substrate to implement an electromagnetic wave shielding effect.

The copper layer may be formed as a thin film. For example, the copper layer may be formed to have a nanometer size.

In the step of sulfurizing the metal layer, the metal layer and a sulfur-containing gas may contact each other within a certain temperature range. For example, the metal layer and the sulfur-containing gas may contact each other at a temperature of 25° C. to 200° C.

Accordingly, the metal layer and the sulfur-containing gas may react with each other to form a metal sulfide layer on the base substrate. That is, when the metal layer includes copper, a copper sulfide layer may be formed on the base substrate.

The sulfur-containing gas may include at least one of hydrogen sulfide ($H_2S$), sulfur dioxide ($SO_2$), methanethiol ($CH_3SH$), dimethyl sulfide (DMS) and dimethyl disulfide (DMDS), but the embodiment is not limited thereto.

A copper sulfide layer may be formed on the base substrate to a thickness equal to or similar to that of the metal layer by reacting the metal layer with the sulfur-containing gas.

The electromagnetic wave shielding film manufactured by the method for manufacturing the electromagnetic wave shielding film according to the embodiment may implement a large-area electromagnetic wave shielding film of 4 inches or more. That is, a large-area electromagnetic wave shielding film may be implemented by a low-temperature process.

In addition, since the electromagnetic wave shielding film manufactured by the method for manufacturing the electromagnetic wave shielding film according to the embodiment directly reacts the metal layer and the sulfur-containing gas to form a copper sulfide layer, a separate coating or transfer process is not performed. Accordingly, the manufacturing process efficiency of the electromagnetic wave shielding film may be improved.

Hereinafter, the present invention will be described in more detail through electromagnetic wave shielding films according to Examples and Comparative Examples. These production examples are only presented as examples in order to explain the present invention in more detail. Therefore, the present invention is not limited to these production examples.

Embodiment Example

Prepare a silicon (Si) substrate.

Subsequently, a copper layer is deposited on the silicon substrate (Si) by using a thermal vacuum evaporator. The copper layer is deposited to a thickness of 5 nm to 20 nm.

Subsequently, the silicon substrate on which the copper layer was deposited was exposed to hydrogen sulfide ($H_2S$) gas for about 10 minutes in a fume hood at room temperature to form a copper sulfide layer on the silicon substrate.

Alternatively, the silicon substrate on which the copper layer was deposited was reacted with hydrogen sulfide ($H_2S$) gas at a temperature of 200° C. for 30 minutes in a tube electric furnace to form a copper sulfide layer on the silicon substrate.

After manufacturing an electromagnetic wave shielding film having the copper sulfide layer formed on the silicon substrate, electromagnetic wave shielding properties and electrical properties were measured.

Comparative Example

Prepare a silicon (Si) substrate.

Subsequently, a copper layer is deposited on the silicon substrate (Si) by using a thermal vacuum evaporator. The copper layer is deposited to a thickness of 10 nm.

After manufacturing an electromagnetic wave shielding film having the copper layer formed on the silicon substrate, electromagnetic wave shielding properties and electrical properties were measured.

Referring to FIG. 7, it can be seen that the electromagnetic wave shielding film according to the embodiment has better electromagnetic wave shielding effect than the electromagnetic wave shielding film according to the comparative example.

That is, the electromagnetic wave shielding film according to the embodiment may have an improved electromagnetic wave shielding effect because the electromagnetic wave scattering effect is induced by the interface of the copper sulfide layer having a multilayer structure.

Referring to FIG. 8, it can be seen that the electromagnetic wave shielding film according to the embodiment has a higher sheet resistance than the electromagnetic wave shielding film according to the comparative example. Accordingly, it can be seen that the electromagnetic wave shielding film according to the embodiment has improved electrical characteristics than the electromagnetic wave shielding film according to the comparative example.

Referring to FIG. 9, it can be seen that the electromagnetic wave shielding film according to the embodiment has better electromagnetic wave shielding characteristics than the electromagnetic wave shielding film according to the comparative example. Accordingly, it can be seen that the electromagnetic wave shielding film according to the example has improved shielding characteristics than the electromagnetic wave shielding film according to the comparative example.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

What is claimed is:

1. An electromagnetic wave shielding film comprising:
   a base substrate; and
   an electromagnetic wave shielding layer disposed on the base substrate,
   wherein the shielding layer includes a base layer disposed on the base substrate and a surface layer disposed on the base layer,
   wherein the base layer includes first crystal grains,
   wherein the surface layer includes second crystal grains, and
   wherein a size of the second crystal grain is different from a size of the first crystal grain.

2. The electromagnetic wave shielding film of claim 1, wherein the electromagnetic wave shielding layer includes copper sulfide.

3. The electromagnetic wave shielding film of claim 1, wherein the shielding layer includes a first layer on the base substrate, a second layer on the first layer, and a third layer on the second layer;
   wherein the first layer, the second layer and the third layer include copper sulfide.

4. The electromagnetic wave shielding film of claim 3, wherein a copper concentration of the shielding layer decreases while extending from the first layer toward the third layer.

5. The electromagnetic wave shielding film of claim 3, wherein a sulfur concentration of the shielding layer increases while extending from the first layer toward the third layer.

6. The electromagnetic wave shielding film of claim 3, wherein a first interface is formed between the first layer and the second layer, wherein a second interface is formed between the second layer and the third layer.

7. The electromagnetic wave shielding film of claim 3, wherein the first layer includes $Cu_aS_b$, wherein the second layer includes $Cu_cS_d$, wherein the third layer includes $Cu_eS_f$, wherein the following equations are satisfied:

$$a>c>e \text{ (}a, c, e \text{ are positive numbers)} \quad \text{[Equation 1]}$$

$$b<d<f \text{ (}b, d, f \text{ are positive numbers)}. \quad \text{[Equation 2]}$$

8. The electromagnetic wave shielding film of claim 1, wherein a size of the second crystal grain is smaller than a size of the first crystal grain.

9. The electromagnetic wave shielding film of claim 1, wherein at least one of the base layer and the surface layer includes a multilayer structure having an interface.

10. The electromagnetic wave shielding film of claim 1, wherein the shielding layer includes one surface in contact with the base substrate and the other surface opposite to the one surface, wherein a pattern layer is disposed on the other surface.

11. The electromagnetic wave shielding film of claim 10, wherein the shielding layer includes an effective area through which light is transmitted and an ineffective area through which light is not transmitted, wherein the pattern layer is disposed on the ineffective area.

12. The electromagnetic wave shielding film of claim 1, wherein the shielding layer has a light transmittance of 70% to 99%.

* * * * *